United States Patent [19]
Campbell et al.

[11] 4,006,412
[45] Feb. 1, 1977

[54] DIGITAL DISPLAY SYSTEM CIRCUIT
[75] Inventors: Kenneth J. Campbell, Solana Beach; Douglas H. Mogle, San Diego, both of Calif.
[73] Assignee: The United States of America as represented by the Secretary of the Navy, Washington, D.C.
[22] Filed: Oct. 29, 1974
[21] Appl. No.: 518,687
[52] U.S. Cl. .............................. 324/96; 307/235 P; 315/185 R; 340/172
[51] Int. Cl.$^2$ ................ G01R 13/02; G01R 31/00; H03K 5/20
[58] Field of Search ......... 324/96, 122; 307/235 N, 307/235 P, 115–117, 36; 315/185, 193; 340/172

[56] References Cited
UNITED STATES PATENTS

| 2,927,207 | 3/1960 | Fiehrer et al. | 340/172 |
| 3,816,822 | 6/1974 | Auchapt | 324/122 |
| 3,894,288 | 7/1975 | Musser, Jr. | 307/235 N |
| 3,927,571 | 12/1975 | Athey | 73/362 AR |

OTHER PUBLICATIONS

Widlar, R. J. "Core Memory Sense Amplifier Designs Using an Integrated Dual Comparator", Fairchild Semiconductor Application Bull., 2–1966, APP 123.
Nirschl, J. C. "Window Comparator Indicates System Status" Electronic Design News/EEE, 6–15–71, pp. 49–50.
Graeme et al. "Operational Amplifiers", McGraw–Hill 1971, pp. 366–368.

Primary Examiner—John K. Corbin
Assistant Examiner—Wm. H. Punter
Attorney, Agent, or Firm—R. S. Sciascia; G. J. Rubens; J. W. McLaren

[57] ABSTRACT

A digital display system is provided for visually indicating the amplitude of a received signal. A plurality of reference signals incrementally graduated from a low amplitude to a high amplitude is applied as first inputs to a polarity of comparators and the received signal as applied as the second input. The comparators produce an output of polarity commensurate with the instantaneous difference between its inputs and a plurality of series-connected light emitting means, each connected between the outputs of two adjacent comparators, is responsive to a predetermined electrical potential for generating light energy so that the instantaneous amplitude level of the received signal is visually indicated by the actuation of a single such light emitting means at a time.

8 Claims, 2 Drawing Figures

DIGITAL DISPLAY SYSTEM CIRCUIT

BACKGROUND OF THE INVENTION

Traditionally the prior art has employed electromechanical devices such as a d'Arsonval galvanometer type of movement to convert an analog signal to a visual numeric indication. More recently in the prior art, cold cathode gas readout tubes have been employed such as the NIXIE tubes commercially available from Burroughs Corporation. This type of tube customarily has a common anode and a plurality of different metallic cathodes, each formed in the shape of a different numeral, alphabetic character, or symbol. The desired character is surrounded with a brilliant glow for providing a visual presentation when the corresponding cathode is energized. Unfortunately, however, cold cathode gas readout tubes are also subject to damage or malfunction due to shock or vibration in that it is essentially electromechanical in structure because the metallic cathodes in filamentary form are mechanically suspended and therefore susceptible to damage from severe shock or vibrational conditions. Additionally, this type of device requires a relatively high voltage of the order of 150 to 200 volts for its operation.

More recently liquid crystal techniques and devices have been employed for the presentation of digital, numeric, alphabetic, and symbolic information. Though liquid crystal techniques and devices obviate some of the disadvantages of other prior art devices, they suffer from the disadvantage that they are relatively expensive, and require complex circuitry for their operation, as well as a special order of voltages.

It is highly desirable in many applications to provide reliable, easy to read, relatively inexpensive means of presenting a digital readout of numeric or comparable information. Accordingly, there is environmental need for a new technique and type of device which will provide long life and reliable performance under extreme enviornmental conditions such as severe shock and vibration.

SUMMARY OF THE INVENTION

The present invention is concerned with a digital display system which is relatively simple in its concept, employs wholly solid state circuitry and elements, is relatively inexpensive to fabricate, compact in size, has a long life and extremely high reliability in operation under severe environmental conditions including shock and vibration. The digital display system of the present invention provides a visual indication of the amplitude of a received signal in numeric form. The system is comprised of a plurality of reference signals which are incrementally graduated from a low amplitude to a high amplitude encompassing the full range of possible amplitudes for the received signal. Such reference signals may be conveniently and appropriately developed from a single source of electrical potential connected to multiple voltage divider means. The multiple voltage divider means may be either of the fixed type or alternatively have a variable tap which affords change and adjustment as may be desired to enlarge the capabilities of the system.

A plurality of comparators having first and second inputs is also provided. The comparators are required to have the capability of producing outputs of different polarities in accordance with the instantaneous difference between its two inputs. That is to say that, for example, if the first input to a comparator is greater than the second input to that same comparator, it will produce a negative output, whereas, when the second input to the comparator is greater in amplitude, or equal to the first input to the comparator, a positively polarized output will be produced by the comparator. Suitable comparators of this type are commercially available in the form of integrated differential operational amplifier circuits, providing solid state desirability as well as being relatively inexpensive and small in size.

The present invention employs a plurality of such comparators with reference signals, such as may be developed from multiple voltage divider means connected to a single electrical potential source, connected as the first input to each of the plurality of comparators; thus, each comparator receives a different reference signal. Each of the comparators is also connected to receive the same second input in the form of the received signal, whose amplitude it is desired to indicate digitally.

A plurality of series-connected, light emitting means is arranged so that each is connected between the outputs of two adjacent comparators. Such light emitting means may take the form of incandescent lamps or preferably light emitting diodes which have extremely long life and very high operative reliability, as well as other solid state attributes.

When the received signal is impressed upon the comparators it will cause an output of negative polarity for all those comparators where it does not exceed the amplitude of the reference signals provided as the other inputs to the comparators. Thus, there will be the same polarity outputs in those comparators and therefore no potential developed across the light emitting means which are connected between their adjacent outputs. Accordingly, the light emitting means will not be activated and no visual indication will be provided.

However, there will be another group of comparators in which the received signal will exceed the reference signal and therefore provide a positive polarity output for such comparators. Adjacent comparators having positively polarized outputs will provide no potential differential across the light emitting means connected between such comparators; but there will be a potential differential between the two comparators where one provides a negative output and the adjacent comparator provides a positive output. Accordingly, the light emitting means between these two adjacent comparators will be activated giving a visual indication that the received signal has a numeric amplitude lying between the two amplitudes of the reference signals for these two adjacent comparators.

Digital indicia, preferably in the form of numerics for instance, are arranged to be visually aligned with a plurality of light emitting means so that a particular light emitting means which is actuated as previously described will indicate the number most nearly representative of the amplitude of the received signal.

It will be apparent to those skilled and knowledgeable in the prior art that higher and finer degrees of resolution may be readily achieved by designing and providing smaller increments of change between the reference signals employed which will accommodate commensurately smaller incremental and digital indicia for visual alignment with a plurality of light emitting means to indicate amplitude with a higher degree of accuracy as may be desired.

In a preferred embodiment of the present invention a noise reduction circuit which may take the form of a simple RC low pass filter may be employed to intercept the received signal before it is impressed upon the plurality of comparators in order to minimize or eliminate the visual jitter which may result from the reception of signals having a relatively high noise content or very rapidly varying small signal fluctuations. Such a noise suppression or low pass filter circuit will operate to effectively average out small signal excursions so that a relatively constant, jitter-free, visual indication is provided.

Accordingly, it is a primary object of the present invention to provide a digital display system for visually indicating the amplitude of a received signal which eliminates disadvantages of comparable prior art techniques and devices.

An equally important object of the present invention is to provide such a digital display system which, because of its concept, is rendered virtually unaffected by severe shock and vibration conditions, enhancing its consistent reliability and significantly extending its operative life.

A further concomitant object of the present invention is to provide such a digital display system readily adapted to implementation entirely from solid state components which are readily available, relatively inexpensive, and compact in size.

Yet a further object of the present invention is to provide such a digital display system which is conceived to be readily readable and may be adapted by design variation to provide widely varying degrees of resolution in its visual indications.

Other objects, advantages and novel features of the invention will become apparent from the following detailed description of the invention when considered in conjunction with the accompanying drawings.

DESCRIPTION OF THE PREFERRED EMBODIMENT

The present invention performs in part in the manner of a so called "window comparator". In the prior art, window comparator circuits which were functionally comparable to circuits of the present invention were considerably more complex, requiring a greater multiplicity of component elements which resulted in their being relatively expensive to accomplish virtually identical results. Such window comparators of the prior art are disclosed in the text entitled "Operational Amplifiers" by Jerald G. Graeme et al, published by McGraw Hill book company in 1971.

At page 365 of that text a schematic wiring diagram for such a prior art window comparator illustrates the requirement of two operational amplifiers, four diodes, and ten resistive elements to provide an output which may be employed to actuate a single light emitting means such as an incandescent lamp or a light emitting diode. Accordingly, it may be readily appreciated that the employment of window comparators of the prior art to produce digital display visual indications comparable to those provided by the present invention would involve a considerably greater number of component elements and a decidedly much more complex circuit arrangement.

Figure 1:
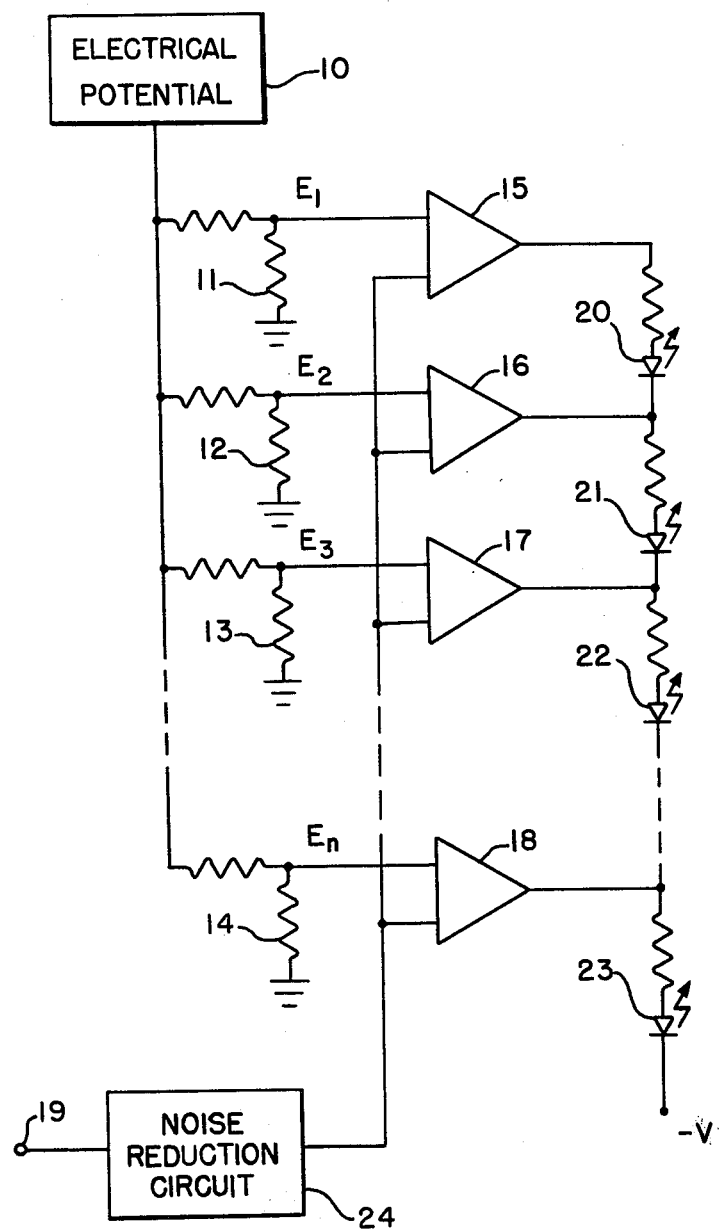
FIG. 1 is a schematic wiring diagram of a typical embodiment of the present invention; and, FIG. 2 is an illustration of the typical visual indication and digital display provided by an embodiment of the present invention.

In FIG. 1 a preferred embodiment of the present invention is illustrated in schematic wiring diagram form. A plurality of predetermined reference signals incrementally graduated from a low amplitude to a high amplitude is generated by the connection of a source of electrical potential 10 to a plurality of voltage dividers 11, 12, 13 and 14. Those skilled and knowledgeable in the pertinent arts will readily appreciate that any number of such voltage dividers may be connected in parallel to a single source of electrical potential to develop any desired degree of resolution in incremental differences in producing the reference signals $E_1$ through $E_n$, though only four such reference signals are shown for purpose of illustration and explanation of the concepts of the present invention.

A plurality of comparators 15, 16, 17 and 18 is provided and each comparator is characterized by the capability of accepting first and second signals for comparison and producing an output signal which is polarized in such a manner as to indicate whether the first signal exceeds the second input signal in amplitude or the second input signal exceeds the first input signal in amplitude. Typically, such comparators may comprise differential operational amplifiers in integrated circuitry "chip" form producing outputs of the order of fifteen volts amplitude, for example.

Such an integrated circuit differential operational amplifier may function to produce a fifteen volt negative polarity output when the amplitude of its reference signal, first input E1, as illustrated in the case of the comparator 15 shown in FIG. 1, exceeds the amplitude of the received signal impressed upon input terminal 19 and commonly connected in parallel as the second input to all the comparators 15, 16, 17 and 18. All the comparators 15, 16, 17 and 18 operate in a similar manner.

Light emitting means 20, 21, 22 and 23 are each connected between the outputs of two adjacent comparators and are responsive to a predetermined electrical potential across such light emitting means for generating light energy. Typically in the practice of the present invention, such light emitting means 20, 21 and 22 may comprise a light emitting diode which has extremely long life, extraordinary high reliability in operation, and is also compact and requires relatively low voltage of the order of fifteen volts for operation. An additional light emitting means 23 may be connected between the output of the last comparator 18 and an appropriate source of potential such as the negative voltage, −V, indicated.

In the preferred embodiment of the present invention it may be desirable to include a noise reduction circuit 24 which can take the form of a low pass filter comprised of simple solid state RC electrical components.

OPERATION

In the operation of an embodiment of the present invention such as that illustrated in FIG. 1 a plurality of reference signals $E_1$ through $E_n$ are developed, preferably incrementally graduated from a low amplitude to a high amplitude in such number of increments to provide the desired degree of resolution in the output of the digital display system. For example, if digital indications of from one to one hundred were desired, it will be necessary to develop $E_1$ through $E_{100}$ in one volt increments. This can readily be done by employing an electrical potential source 10 which may be in the order of one hundred volts or more and using the plurality of voltage dividers 11, 12, 13, 14, etc., to produce reference signals which are incrementally graduated by one volt each. The plurality of comparators are connected to accept the plurality of reference signals, which differ from each other in increments of one volt, as the first of two inputs to each comparator.

These comparators may be of the integrated circuit differential operational amplifier type in chip form and are operable to produce a negative potential of 15 volts for instance, when the second input to a particular amplifier does not exceed its reference signal input and conversely to produce a positive output of fifteen volts when the second input exceeds its reference signal input. Thus, for instance, if it is assumed that $E_1$ is one volt, $E_2$ is two volts and $E_3$ is three volts, and a received signal impressed upon input terminal 19 of the digital display system is of the order of approximately two and one half volts, the differential operational amplifier 15 would operate to produce a positive fifteen volt output since the received signal providing a second input to that the comparator 15 exceeds its first input in the form of the one volt reference signal.

Similarly, the differential operational amplifier 16 would produce a positive 15 volt output since the two and one half volt received signal providing its second input exceeds its two volt first input reference signal; therefore, the light emitting means 20 would not be activated since no potential difference is developed across it, both the outputs of comparator 15 and 16 being at a positive 15 volt level.

However, the differential operational amplifier 17 would operate to produce a negative 15 volt output since the two and one half volt received signal (its second input) does not exceed its three volt reference signal (its first input). Therefore, a potential is developed across the light emitting means 21 indicating that the received signal has an amplitude between two and three volts.

The light emitting means 21 is visually aligned with digital indicia indicating two and three volts, providing the desired appropriate digital display. The remaining plurality of comparators operate in a similar manner including the Nth comparator as represented by comparator 18 in FIG. 1. Comparator 18 has its output connected to an additional light emitting means 23 which in turn is connected to an appropriate amplitude of negative potential as represented by −V which in case of the illustration discussed above would be a negative fifteen volt potential. Thus, the last of the comparators, such as that illustrated at 18, would operate to produce a negative output potential of approximately 15 volts in the case assumed for illustrative purposes wherein the received signal impressed upon the input terminal 19 is of the order of two and one half volts, since $E_n$ would be the larger of the two input signals to the comparator 18. Thus, because of the negative 15 volt potential connected to its other side, the light emitting means 23 would not be actuated.

However, it can readily be appreciated that when the received signal impressed upon the input terminal 19 exceeds $E_n$, the reference signal provided as the first input to the Nth comparator 18, a positive output potential of 15 volts is produced which creates a potential difference across the light emitting means 23 causing it to light. Since all the other comparators similarly are caused to produce a like positive output potential of 15 volts there is no potential difference across any of the other light emitting means 20, 21, and 22 so that they are not actuated. Accordingly, only the light emitting means 23 is actuated, indicating that the received signal impressed upon the input terminal 19 is of the highest indicatable value.

Figure 2:
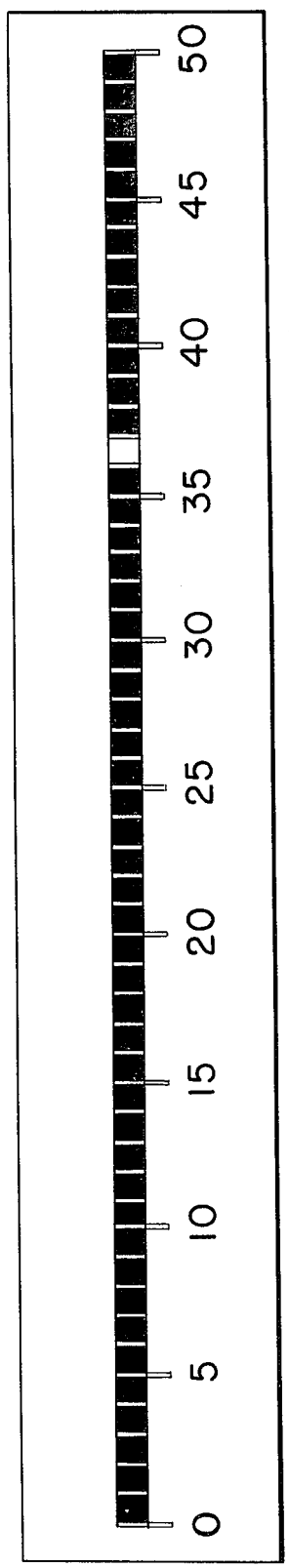

FIG. 2 is an enlarged illustration of the manner conceived by the present invention, in which a plurality of 50 light emitting means is aligned visually with digital indicia from zero through 50 to provide a visual indication of an input signal from zero to 50 amplitude increments.

In the illustration of FIG. 2, 50 light emitting means are provided with only the light emitting means between the numerical indicia 36 and 37 actuated indicating a digital value between 36 and 37. However, as will be readily apparent to those skilled and knowledgeable in the pertinent arts, a wide variety of different degrees of resolution may be obtained in accordance with the requirements of each practical application of the present invention through the use of a greater number of light emitting diodes or a lesser number of light emitting means as may be advisable in each instance.

Accordingly, the present invention affords the desirability of a window comparators technique in a digital display system but employs significantly lesser number of components than was required in accordance with prior art practices and techniques.

Moreover, the concept of the present invention is such that it may readily and preferably be embodied in wholly solid state components which are virtually impervious to severe environmental conditions particularly severe shock and vibration.

Additionally, the concept of the present invention is such that it may be embodied in an extremely compact space-saving design which is admirably suited to most of its practical applications.

Obviously many modifications and variations of the present invention are possible in the light of the above teachings. It is therefore to be understood that within the scope of the appended claims the invention may be practiced otherwise than as specifically described.

What is claimed is:

1. A digital display system circuit for visually indicating the amplitude of a received signal comprising:

a plurality of reference signals incrementally graduated from a low amplitude to a high amplitude;

a plurality of comparators having first and second inputs, each of said comparators having its first input connected to a different one of said reference signals and its second input connected to said received signal for producing an output of fixed amplitude of one polarity when its second input exceeds its first input and producing an output of substantially the same fixed amplitude but of opposite polarity in response to lesser amplitudes of said second input; and a plurality of series connected light emitting means, each connected between the outputs of two adjacent comparators and responsive to the electrical potential developed by a difference of polarity therebetween for energizing one of said light emitting means indicating that the received signal has an amplitude within the range of the two incrementally graduated reference signals connected as first inputs to the two adjacent comparators developing said difference of polarity therebetween.

2. A digital display system circuit as claimed in claim 1 including digital indicia visually aligned with said plurality of light emitting means.

3. A digital display system circuit as claimed in claim 1 wherein said plurality of reference signals comprises a source of electrical potential connected to multiple voltage divider means.

4. A digital display system circuit as claimed in claim 1 wherein said comparators comprise differential operational amplifier circuits.

5. A digital display system cirucit as claimed in claim 1 wherein said light emitting means comprises light emitting diodes.

6. A digital display system circuit as claimed in claim 5 and including current limiting resistive means connected in series with each of said light emitting diodes.

7. A digital system circuit as claimed in claim 1 and including a noise reduction circuit connected for stabilizing said received signal.

8. A digital display system circuit as claimed in claim 7 wherein said noise reduction circuit comprises a low pass filter.

* * * * *